United States Patent [19]

Sugimoto et al.

[11] 4,010,652
[45] Mar. 8, 1977

[54] ACTUATOR FOR PUSHBUTTON TUNER

[75] Inventors: Yoshihiro Sugimoto; Tsunefusa Suzuki, both of Tokyo, Japan

[73] Assignee: Nihon Technical Kabushiki Kaisha, Japan

[22] Filed: May 15, 1975

[21] Appl. No.: 577,766

[30] Foreign Application Priority Data

May 20, 1974 Japan .................. 49-56374[U]

[52] U.S. Cl. ...................... 74/10.33; 74/10.27; 74/10.31; 334/7
[51] Int. Cl.² ........................................ F16H 35/18
[58] Field of Search .......... 74/10.33, 10.31, 10.27, 74/10.35, 10.37; 334/7

[56] References Cited

UNITED STATES PATENTS

| 3,646,821 | 3/1972 | Clark | 334/7 |
| 3,727,156 | 4/1973 | Olah | 334/7 |
| R27,179 | 9/1971 | Newman | 74/10.27 |

Primary Examiner—Samuel Scott
Assistant Examiner—Randall Heald
Attorney, Agent, or Firm—Robert E. Burns; Emmanuel J. Lobato; Bruce L. Adams

[57] ABSTRACT

An interconnecting member which operatively connects a pushbutton slide with either one of a pair of tuning slides comprises a flat body portion which has its one end pivotally connected with the pushbutton slide. At its other end, the body portion is provided with means for mechanically engaging with one of the pair of tuning slides selectively. The body portion is also provided, at said other end, with means for engaging with shift means which shifts the interconnecting member from one operational position to the other operational position. The interconnecting member moves angularly across the surface of the pushbutton slide in response to an operation of the shift means.

2 Claims, 3 Drawing Figures

U.S. Patent  Mar. 8, 1977  4,010,652
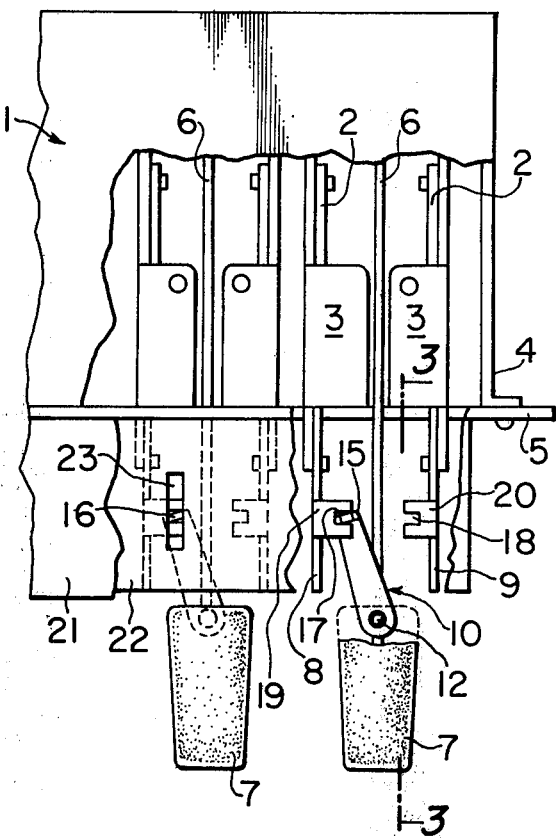
FIG. 1
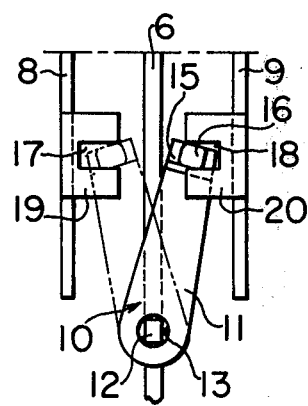
FIG. 2
FIG. 3
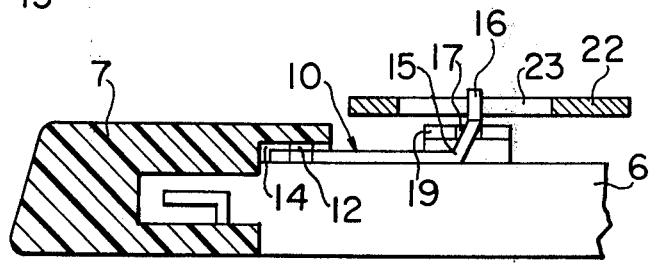

ACTUATOR FOR PUSHBUTTON TUNER

The invention relates to an actuator of pushbutton tuner, and more particularly to a band switching mechanism which operatively connects a pushbutton slide with a selected one of a pair of tuning slides which are located on the opposite sides of the pushbutton slide.

A pushbutton tuner is known in which a pushbutton slide is adapted to be operatively connected with either one of a pair of tuning slides selectively. In a tuner a this type, one of the tuning slides is used for the selection of an AM broadcasting band while the other is used to select a station in an FM broadcasting band. The pushbutton slide carries an interconnecting member having a lever arm or pin, and which is adapted to tilt or slide laterally for engagement with either one of the adjacent tuning slides. Each tuning slide is formed with a slot which receives the lever arm or pin provided on the interconnecting member. An actuator having a tiltable interconnecting member is described, for example, in U.S. Pat. No. 3,357,264 issued to G. H. Newman on Dec. 12, 1967. In the actuator of this patent, the interconnecting member comprises a toggle lever having a pair of arms and a stem which is pivotally connected with a pin provided on the pushbutton slide. In U.S. Pat. No. 3,415,129 issued to R. D. Stamm on Dec. 10, 1968, there is proposed the provision of an opening in the interconnecting member having a pair of arms for assuring an exact engagement with a sleeve-shaped component on the pushbutton slide, thus permitting a direct pivotal connection of the interconnecting member with the sleeve-shaped component. However, these actuators require a very close manufacturing tolerance, and the actuator must be pivotally mounted on the pushbutton slide in a manner such that a smooth motion is accomplished. On the other hand, U.S. Pat. No. 3,722,299 issued to Knight et al. on Mar. 27, 1973 describes a different type of the actuator having an interconnecting member which is adapted to slide laterally. Specifically, the interconnecting member comprises a T-shaped pin, with the horizontal arm of the pin being located within a guide formed in the pushbutton slide and with the upstanding portion of the pin being located in a slot of a laterally shiftable plate. This type of actuator does not involve the manufacturing and assembling difficulties mentioned above in connection with the cited two U.S. Patents, but the end of the upstanding portion of the T-shaped pin which bears against the shift plate, produces a force which, in addition to urging the pin laterally, also urges it downward, whereby there is generated between the pin and the guide an appreciable amount of sliding friction which prevents a smooth operation of the shift plate.

Therefore, it is an object of the invention to provide an actuator of pushbutton tuner which is simple in structure, using parts which can be easily manufactured and assembled.

It is another object of the invention to provide an actuator of double band pushbutton tuner having an interconnecting member which is operated in response to a movement of a shift plate without overloading the latter.

In the actuator of pushbutton tuner according to the invention, an interconnecting member is pivotally mounted on a pushbutton slide, and moves angularly in the plane of the pushbutton slide concurrently with the lateral movement of the shift plate, thereby operatively connecting the pushbutton slide with either one of a pair of tuning slides selectively. The interconnecting member may be in the form of a single piece of metallic flat and elongate body, which is formed with an aperture at its one end while its other end is bent at right angles to the plane of the remainder. The aperture engages a pivot on the pushbutton slide, and the free end which is bent a right angles is constrained within a slot in a shift plate. The free end also engages with a slot in a selected tuning slide.

The above and other objects, features and advantages of the invention will become apparent from the following detailed description of an embodiment thereof with reference to the drawings, in which:

FIG. 1 is a plan view, partly cut away, of the pushbutton tuner constructed in accordance with the invention;

FIG. 2 is a plan view of the interconnecting member shown in an operational position which is different from that shown in FIG. 1; and FIG. 3 is a cross section taken along the line 3—3 shown in FIG. 1.

For clarity and brevity of description, a tuning mechanism 1 in which the actuator according to the invention is used is not shown in detail and may comprise any conventional design, since such detail is not a part of the invention. For the sake of convenience, only a tuning cam 2 and its associated positioning means 3 are shown in the drawings.

A conventional double band pushbotton tuner comprises a plurality of pushbutton slides 6 which extend through a front wall 5 of a framework 4 in a parallel arrangement Each pushbutton slide carries a pushbutton 7 on the end of its forward extension, and is mounted in a stationary guide channel within the framework 4 so as to move from a forward inoperative position to a rearward operative position as the pushbutton is depressed. In the description to follow, the term "forward" refers that side which is nearer an operator or a downward direction as viewed in FIG. 1 while the term "rearward" refers to the upward side, as viewed in FIG. 1. A pair of tuning slides 8, 9 are disposed on the opposite sides of each pushbutton slide 6 and carry tuning cams 2 and associated positioning means 3, respectively. Each of the tuning slides 8, 9 is also slidably mounted within a stationary guide channel within the framework so as to be movable between a forward inoperative position and a rearward operative position.

An interconnecting member for operationally connecting the pushbutton slide 6 with either one of the pair of tuning slides 8, 9 is generally shown by reference numeral 10. As will be apparent from FIG. 2, the interconnecting member 10 comprises an elongate body portion 11 which is formed at its one end with an aperture 13 which engages a pivot 12 on the forward extension of the pushbutton slide 6.

To prevent disengagement of the interconnecting member 10 from the pivot 12, the pivot 12 is received within an opening 14 in the pushbutton 7 which is fitted over the forward end of the pushbutton slide 6. The opening 14 is large enough to permit an angular movement of the interconnecting member 10 therein. The other end of the body portion 11 is bent in a generally upward direction to form an inclined cam portion 15 and an upright pin portion 16. A pair of flaps 19, 20 having oppositely directed notches 17, 18 formed therein are attached to the forward extension of each tuning slide 8, 9, and are located so that the notches 17, 18 are on the path of angular movement of the cam portion 15 of the interconnecting member 10 which is pivotally mounted on the pushbutton 6 when both the pushbutton slide 6 and the pair of tuning slides 8, 9 are in their forward inoperative positions. In addition, the configuration and size of the notches 17, 18 and the cam portion 15 are such that when the interconnecting member 10 assumes its left-hand position as shown in FIG. 1, the cam portion 15 is received within the notch 17 to operatively connect the pushbutton slide 6 with the selected tuning slide 8. Similarly, when the interconnecting member 10 assumes its right-hand position, the cam portion 15 will be received in the notch 18 of the flap 20 provided on the right-hand tuning slide 8, thereby connecting the pushbutton slide 6 with the tuning slide 9. A shift plate 22 is carried by a support plate 21 of the framework 4 so as to be shiftable in the lateral direction or to the right and left as viewed in FIG. 1, and operates to displace all the interconnecting members 10 associated with the respective pushbutton slides 6 simultaneously from one of their operational positions to the other. Specifically, the shift plate 22 is formed with a plurality of elongate slots 23, each associated with one of the pushbutton slides 6 and the interconnecting members 10. The upright pin portion 16 at the free end of the interconnecting member 10 is constrained within the slot 23 in any position of the associated pushbutton slide 6. While not shown, the support plate 21 and the shift plate 22 are connected together in a known manner so that the shift plate 22 moves laterally in response to an operation of a switching lever. When the shift plate 22 moves to the left, all the interconnecting members 10 will move angularly to the left, so that the interconnecting members 10 cause the pushbutton slides 6 to be operatively connected with the left-hand tuning slides 8. When one of the pushbutton slides 6 is moved from its forward inoperative position to its rearward operative position, the associated interconnecting member 10 causes the selected tuning slide 8 to move simultaneously. As the inclined cam portion 15 of the interconnecting member 10 bears against the wall of the notch 17 in the flap 19 of the tuning slide 8, it produces a force which not only causes the tuning slide 8 to move to its rearward operative position, but also depresses it downward. It is known that such vertical component of the force is effective to establish a reference position for the tuning cam 2 which moves together with the tuning slide 8. As the pushbutton slide 6 and the tuning slide 8 move through the stationary guide channels, the upright pin 16 of the interconnecting member 10 move lengthwise of the slot 23 in the shift plate 22 to maintain the operative connection therebetween. When the shift plate 22 is displaced to the right, the body portion 11 of the interconnecting member 10 moves over the pushbutton slide 6 with its upright pin 16 angularly moving to the right while remaining within the slot 23 of the shift plate 22.

The actuator according to the invention can be readily made as a single flat and elongate piece of metal, and can be simply assembled by engaging the aperture 13 with the pivot 12 on the pushbutton slide 6. In actual assembly, the interconnecting member 10 is engaged with the pushbutton slide 6 before the pushbutton 7 is fitted over the forward end of the pushbutton slide 6. It will be understood that both these operations are very simple. During the use of the actuator, the interconnecting member 10 is caused to slide over the pushbutton slide 6, moving angularly in the plane thereof. It will be appreciated that the direction of such movement is generally perpendicular to the length of the body portion 11, so that no appreciable sliding contact takes place between the body portion 11 and the pushbutton slide 6. Even if the aperture 13 at one end of the interconnecting member 10 is a loose fit with the pivot 12, the engagement of the upright pin 16 at its other end with the slot 23 in the shift plate 22 prevents an amount of tilting of the body portion 11 which would resist the movement of the latter, thereby enabling the shift plate 22 to be operated with a reduced force.

While there has been shown and described a preferred embodiment of the present invention, it should be readily apparent to those skilled in the art that various changes are modifications can be made therein without departing from the scope of the invention. For example, the cam portion 15 of the interconnecting member 10 may be replaced by a pair of laterally extending arms for cooperation with notches formed in the surfaces of the tuning slides 8, 9 in place of the notches 17, 18 of the flaps 19, 20. In a further modification, the interconnecting member 10 may comprise a single upright pin which also serves the function of the cam portion 15. Therefore, it is intended that the scope of the invention is solely limited by the appended claims.

Having described the invention, what is claimed is:

1. Tuner actuator mechanism comprising, a plurality of parallel pushbutton slides movable axially between an inoperative position and an operative position, for each pushbutton slide a pair of tuning slides connectable operatively with a common slide therebetween and parallel thereto, for each pushbutton slide an interconnecting member for operatively connecting a corresponding pushbutton slide alternatively with either one of the tuning slides associated therewith and for maintaining the operative connection so that a selected tuning slide can be moved between its inoperative position and its operative position as the pushbutton slide is actuated, shift means for moving each interconnecting member alternatively to a pair of operational positions in order to release an operative connection between a pushbutton slide and a selected tuning slide and to operatively connect the pushbutton slide with the other tuning slide associated therewith, said interconnecting member comprising a single-piece member having a flat body portion with one end pivotally connected with the corresponding pushbutton and an upwardly inclined cam portion as an extension of said body portion terminating in a pin in a plane substantially normal to said flat body portion at a free end of said interconnecting member, said shaft means having individual slots in which individual pins of corresponding interconnecting members are received for actuating of the interconnecting members to said pair of operational positions thereof, each pair of said tuning slides having opposed notches on opposite sides of the corresponding common pushbutton slide and interconnecting member for alternatively receiving the corresponding cam portion thereof for effecting an operative connection between the pair of tuning slides and the corresponding associated pushbutton slide, and said notches each having parallel side edges engaging the inclined cam portion on opposite sides thereof for applying a downward component of force on said inclined cam and corresponding tuning slide when the corresponding pushbutton is actuated to said operative position.

2. Tuner actuator mechanism according to claim 1, in which each pushbutton slide comprises a pushbutton on an end thereof, each pushbutton having a pivot on which said flat body portion of a corresponding interconnecting member pivots, each flat body portion having an opening for receiving a corresponding pin therein, each connecting member overlying the corresponding pushbutton contact, each pushbutton having an end notch in which an end of the corresponding pushbutton slide is received, and said pivot extending into said notch.

* * * * *